United States Patent [19]

Orcutt

[11] Patent Number: 5,736,792
[45] Date of Patent: Apr. 7, 1998

[54] METHOD OF PROTECTING BOND WIRES DURING MOLDING AND HANDLING

[75] Inventor: John W. Orcutt, Richardson, Tex.

[73] Assignee: Texas Instruments Incorporated, Dallas, Tex.

[21] Appl. No.: 697,660

[22] Filed: Aug. 28, 1996

Related U.S. Application Data

[60] Provisional application No. 60/002,966, Aug. 30, 1995.

[51] Int. Cl.⁶ .......................... H01L 23/50; H01L 23/48; H01L 23/30; H01L 23/28
[52] U.S. Cl. .................. 257/783; 257/779; 257/784; 257/695; 257/772
[58] Field of Search .................. 257/690, 692, 257/693, 695, 698, 772, 779, 782, 783, 784, 786, 673

[56] References Cited

U.S. PATENT DOCUMENTS

| | | | |
|---|---|---|---|
| 4,707,725 | 11/1987 | Ito | 257/786 |
| 4,819,041 | 4/1989 | Redmond | 257/784 |
| 4,888,634 | 12/1989 | Lai et al. | 257/783 |
| 5,359,227 | 10/1994 | Liang et al. | 257/692 |
| 5,389,738 | 2/1995 | Piosenka et al. | 257/783 |
| 5,569,956 | 10/1996 | Chillara et al. | 257/692 |

FOREIGN PATENT DOCUMENTS

| | | | |
|---|---|---|---|
| 0569949 | 12/1993 | European Pat. Off. | 257/690 |
| 0090949 | 5/1984 | Japan | 257/772 |
| 0102761 | 6/1985 | Japan | 257/772 |
| 62-176150 | 8/1987 | Japan | 257/782 |
| 1-128552 | 5/1989 | Japan | 257/783 |
| 0268045 | 10/1989 | Japan | 257/692 |
| 4-213864 | 8/1992 | Japan | 257/784 |
| 0235241 | 9/1993 | Japan | 257/772 |
| 6-21175 | 1/1994 | Japan | 257/786 |

*Primary Examiner*—Tom Thomas
*Assistant Examiner*—Alexander Oscar Williams
*Attorney, Agent, or Firm*—Alan K. Stewart; James Wade Brady, III; Richard L. Donaldson

[57] ABSTRACT

A method of making a semiconductor device and the device wherein a chip is provided having plural bond pads thereon. A plurality of adjacent wires is provided, each wire having one end thereof coupled to and extending from one of the bond pads. The other end of each wire is coupled to one of a plurality of lead fingers. A mass of hardenable, flowable adhesive having a viscosity in its flowable state sufficient to enable the adhesive to rest on a the wire until hardened, preferably an epoxy, is disposed on adjacent wires and the adhesive is then hardened. Optionally, some of the adhesive is permitted to be disposed on a surface of the chip and beneath a wire and then hardened.

12 Claims, 1 Drawing Sheet

METHOD OF PROTECTING BOND WIRES DURING MOLDING AND HANDLING

This application claims the benefit of U.S. Provisional Application No. 002,966, filed Aug. 30, 1995.

BACKGROUND OF THE INVENTION

1. Field of the Invention

This invention relates to a method of protecting bond wires during fine pitch wire bonding and particularly for such wire bonding to pads of semiconductor devices.

2. Brief Description of the Prior Art

Connection between semiconductor chips and the outside world are generally provided through bond pads disposed on the surfaces of the chips. Due to the constant increase in the number of electrical components capable of being disposed in a given volume of semiconductor material, the circuitry contained in the chips has become increasingly more complex. This has made it necessary to increase the number of pins in the package containing the chip and has also led to an increase the number of bond pads on a chip. In order to accommodate this increase in the number of pins and bond pads, the pitch of the bond pads must be reduced and longer bond wires are required. As the wires increase in length, they tend to sag and can easily cause a malfunction, such as, for example, a short circuit, by sagging against another electrically conductive element from which it should be electrically isolated.

To date, most improvements in long wire capability have been provided by (1) improved looping profiles, (2) improved wire, (3) low viscosity mold compounds and (4) better molding processes. Another prior art approach has been to use a looping ring which is positioned between the die pad and the lead finger between which a wire is to be connected. The wire then extends over the looping ring and is supported thereby, preferably at the highest point on the wire, to minimize to problem caused by wire sag.

With the further decrease in dimensions, the wires, which must be separated during handling and molding, continue to move closer together. This presents a severe problem, especially during molding, because the molding composition tends to move the wires in the direction of molding composition flow and can cause adjacent wires to move against each other.

SUMMARY OF THE INVENTION

In accordance with the present invention, the above noted problems of the prior art are minimized and there is provided a mechanism and procedure whereby the wires are maintained separated from each other during handling and/or molding.

Briefly, the above is accomplished by dispensing an adhesive, preferably an epoxy and preferably an adhesive which can be dispensed in a flowable state and then harden, around the already bonded and separated wires, preferably at the highest point on each wire, this being the location of the looping ring of the prior art. The adhesive will rest on the top of each wire wherein separation from an adjacent wire may be a problem and will be interconnected as a single mass from wire to adjacent wire with the adhesive being connected to at least one pair of adjacent wires. Some of the adhesive may drop to the underside or beneath the wire. This ties each wire to the adhesive and maintains the wires separated from each other during handling and molding. The adhesive is preferably an adhesive which can be dispensed in a flowable state and then harden and is preferably an epoxy. The adhesive viscosity must be such that the adhesive will rest on the wire surface for a sufficiently long period to harden before a substantial portion thereof can drip off of the wire. The adhesive viscosity must also be such that it maintains contact with the adhesive on adjacent wires through hardening and maintains such contact thereafter. It can be seen that if some of the adhesive drops beneath the wires and is retained on the chip surface below the wires, the adhesive will then provide the uplifting action of the prior art looping ring in addition to providing the wire separation of the adhesive as discussed above.

In operation, wires will be bonded in standard manner between die pads on a chip and lead fingers with the wires extending upwardly from the die pad and then looping downwardly to the die finger. The flowable adhesive is then dispensed over the wires, preferably at the top of the loop, so that the adhesive disposed over any wire also contacts the adhesive disposed over the adjacent wire or wires and the adhesive is allowed to harden. Accordingly, when the adhesive hardens, the wires are separated from each other and remain in that relation due to the interconnecting nature of the adhesive from wire to wire. The chip can then be handled and/or molding composition can be placed over the chip with the wires retaining their separated position relative to each other. If some of the adhesive drops onto the surface of the chip beneath the wire, such adhesive will serve the additional function of the looping ring of the prior art. It can be seen that the function of the looping ring can be provided without the additional steps of positioning and adhering the looping ring as required in the prior art. Also, the precision of positioning the looping ring of the prior art is not necessary.

DESCRIPTION OF THE PREFERRED EMBODIMENT

Figure 1:
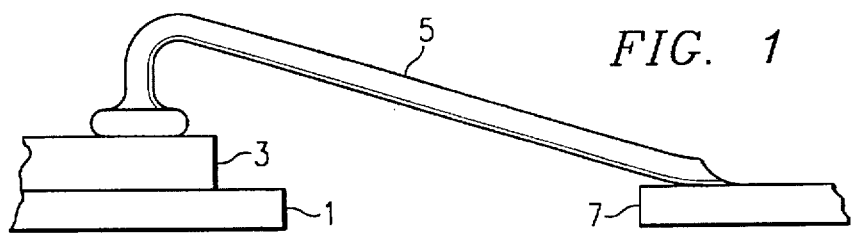
FIG. 1 is a side view of a standard prior art die pad and lead finger with a wire connected therebetween.

Referring first to FIG. 1, there is shown a standard prior art chip 1 having a plurality of die pads 3, only one of which is shown. A wire 5 is looped upwardly from the die pad 3 and then downwardly to a lead finger 7 which is part of a lead frame (not shown) having pins which extend out of the final package.

Figure 2:
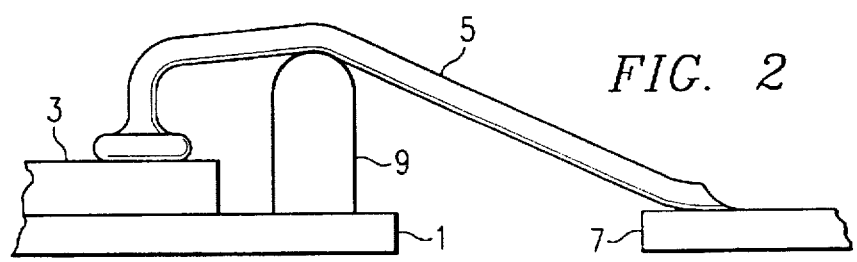
FIG. 2 is a side view of a standard die pad and lead finger with a wire connected therebetween, the wire being supported at its highest point with a looping ring in accordance with the prior art.

FIG. 2 shows the structure of FIG. 1 with a prior art looping ring 9 disposed in the vicinity of the highest point of the wire. The looping ring 9 minimizes the likelihood of the wire 5 contacting circuitry on the chip 1 other than the bond pad 3. The looping ring 9 also prevents movement of the wires 5 in the plane normal to the page showing FIG. 2 and thereby does not prevent adjacent wires from contacting each other during handling and/or encapsulation.

Figure 3:
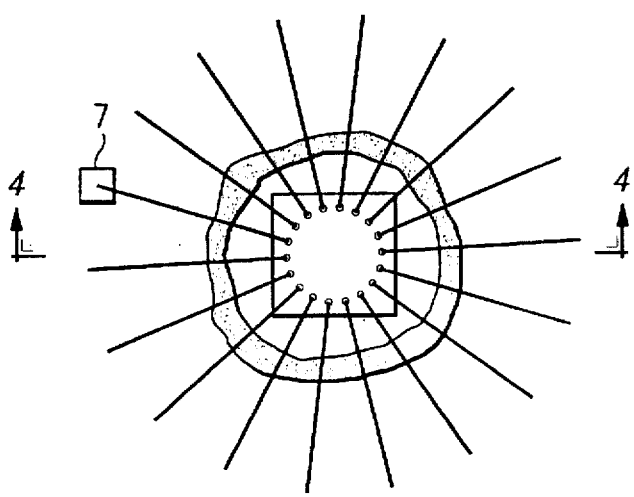
FIG. 3 is a top view of a semiconductor chip with wires extending from the die pads thereof and a ring of adhesive in accordance with the present invention.
Figure 5:
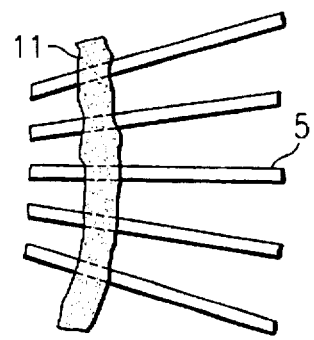
FIG. 5 is an enlarged view of a portion of the wires of FIG. 3 and bond ring thereon.
Figure 4:
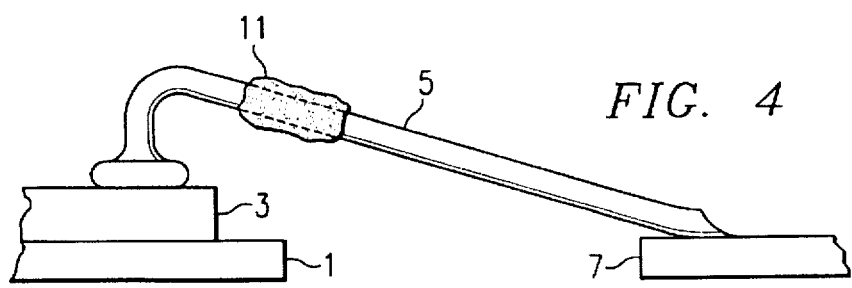
FIG. 4 is a view taken along the line 4—4 of FIG. 3.

Referring now to FIGS. 3 to 5, there is shown a wire protection scheme in accordance with the present invention.

There is shown a chip 1 having die pads 3, best shown in FIG. 4. There will be a plurality of die pads 3, one die pad generally being associated with one wire 5. A wire 5 is shown bonded to each die pad 3 and to a lead finger 7 as in the prior art. The wires 5 will be separated from each other and disposed above the surface of the chip 1. A ring of flowable, hardenable epoxy of proper viscosity 11 is then disposed over the wires 5 in a continuous ring and allowed to harden in situ on the wires. It should be understood that, while the epoxy adhesive 11 is shown as a continuous ring in the preferred embodiment, the adhesive need only extend between those wires 5 which will or may require separation assistance up to and including the encapsulation procedure, thereby allowing the adhesive to be discontinuous, if appropriate. The chip can then be handled and/or packaged with minimal likelihood of malfunction due to improper contact with the wires 5.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. A semiconductor device which comprises:
   (a) a chip having plural bond pads thereon;
   (b) a plurality of wires disposed adjacent each other, each of said wires having a first end coupled to one of said bond pads;
   (c) a plurality of lead fingers, each of said wires having a second end coupled to one of said lead fingers; and
   (d) a unitary mass of hardened adhesive disposed over and secured to each of said wires to provide separation of said wires from each other, the unitary mass is separated from the bond pads and the lead fingers.

2. The device of claim 1 further including a second plurality of adjacent wires, each of said second plurality of adjacent wires having a first end coupled to one of said bond pads and a second end coupled to one of said lead fingers; and a second unitary mass of hardened adhesive disposed over and secured to said second plurality of adjacent wires to provide separation of said second plurality of adjacent wires from each other.

3. The device of claim 1 wherein said adhesive is flowable, hardenable and has a viscosity in its flowable state sufficient to enable said adhesive to rest on a said wire until hardened.

4. The device of claim 1 wherein said adhesive is flowable, hardenable and has a viscosity in its flowable state sufficient to enable said adhesive to rest on a said wire until hardened.

5. The device of claim 1 further including a portion of said adhesive disposed beneath a said wire on a surface of said chip.

6. The device of claim 3 further including a portion of said adhesive disposed beneath a said wire on a surface of said chip.

7. A method of making a semiconductor device comprising the steps of:
   (a) providing a chip having plural bond pads thereon and a plurality of wires adjacent each other, each of said adjacent wires having a first end coupled to one of said bond pads;
   (b) adhering a second end of each wire to a lead finger; and
   (c) forming a unitary mass of hardened adhesive over and secured to each of at least an adjacent pair of said wires to provide separation of said wires from each other, the unitary mass is separated from the bond pads and the lead fingers.

8. The method of claim 7 further including the step of providing a second plurality of wires adjacent each other, each of said second plurality of wires having a first end coupled to one of said bond pads and a second end coupled to one of said lead fingers; and providing a second unitary mass of hardened adhesive disposed over and secured to each of said second plurality of wires to provide separation of said second plurality of wires from each other.

9. A method of making a semiconductor device comprising the steps of:
   (a) providing a chip having plural bond pads thereon, a plurality of adjacent wires, each said wire having a first end coupled to one of said bond pads, a second end of said wire coupled to one of a plurality of lead fingers;
   (b) disposing a unitary mass of hardenable, flowable adhesive having a viscosity in its flowable state sufficient to enable said adhesive to rest on a said wire until hardened, the unitary mass is separated from the bond pads and the lead fingers; and
   (c) hardening said adhesive.

10. The method of claim 9 wherein said adhesive is an epoxy.

11. The method of claim 9 further including the step of permitting some of said adhesive in step (b) to be disposed on a surface of said chip and beneath a said wire and hardening said adhesive on said surface of said chip.

12. The method of claim 10 further including the step of permitting some of said adhesive in step (b) to be disposed on a surface of said chip and beneath a said wire and hardening said adhesive on said surface of said chip.

* * * * *